United States Patent [19]
Jang

[11] Patent Number: 5,436,866
[45] Date of Patent: Jul. 25, 1995

[54] LOW-POWER, HIGH-SPEED SENSE AMPLIFIER

[75] Inventor: Seong J. Jang, Bubaleub, Rep. of Korea

[73] Assignee: Hyundai Electronics Industries Co., Ltd., Rep. of Korea

[21] Appl. No.: 319,300

[22] Filed: Oct. 6, 1994

[30] Foreign Application Priority Data

Oct. 6, 1993 [KR] Rep. of Korea ............... 1993-20668

[51] Int. Cl.$^6$ ............................................. G11C 7/00
[52] U.S. Cl. ................................. 365/208; 365/189.11; 365/207; 327/51
[58] Field of Search ............... 365/208, 207, 206, 205, 365/189.11; 327/51, 52, 53

[56] References Cited

U.S. PATENT DOCUMENTS

| | | | |
|---|---|---|---|
| 4,618,785 | 10/1986 | Van Tran | 365/208 |
| 4,636,664 | 1/1987 | Craycraft et al. | 327/51 |
| 4,984,204 | 1/1991 | Sato et al. | 365/189.11 |
| 5,301,158 | 4/1994 | Yokomizo | 365/205 |
| 5,371,703 | 12/1994 | Miyamoto | 365/207 X |
| 5,377,143 | 12/1994 | McClure | 365/189.11 X |

Primary Examiner—Joseph A. Popek
Assistant Examiner—Son Dinh
Attorney, Agent, or Firm—Merchant, Gould, Smith Edell, Welter & Schmidt

[57] ABSTRACT

A low-power, high-speed sense amplifier for a memory device with at least one memory cell, comprising a voltage shifter for inputting voltages from data bus and data bus bar lines connected respectively to bit and bit bar lines connected to the memory cell and, in response to a sense amplifier enable signal, decreasing the inputted voltages and shifting the decreased voltages, a current sense amplification circuit responsive to the sense amplifier enable signal for sensing current of an output voltage from the voltage shifter to increase a gain thereof, and a voltage sense amplification circuit for sensing a difference between the output voltage from the voltage shifter and an output voltage from the current sense amplification circuit.

10 Claims, 4 Drawing Sheets

UNLOCK DETECTOR

LOW-POWER, HIGH-SPEED SENSE AMPLIFIER

BACKGROUND OF THE INVENTION

1. Field of the Invention

The present invention relates in general to a sense amplifier used to read data from a cell of a static random access memory (SRAM), and more particularly to a sense amplifier which is stably operated at a high speed with low power consumption.

2. Description of the Prior Art

Generally, in order to read data from a cell of an SRAM, a sense amplifier senses and amplifies two signals from bit and bit bar lines connected to the memory cell. The bit line is active high, whereas the bit bar line is active low.

Referring to FIG. 1, there is shown a circuit diagram of an SRAM to which a conventional sense amplifier is applied. In this drawing, the reference numeral 11 designates a cell, 12 a bit line, 12' a bit bar line, 13 a word line, 14 a pull-up circuit, 15 a transfer gate circuit, 16 a cell data bus line, 16' a cell data bus bar line, 17 an enable signal SAE supply line, 18 and 18' a pair of current mirror-type sense amplification circuits, and 19 a voltage sense amplification circuit, respectively.

When the bit and bit bar lines 12 and 12' are operated in the neighborhood of a supply voltage by PMOS transistors of the pull-up circuit 14, the operated voltages are transferred to the data bus and data bus bar lines 16 and 16' through the transfer gate circuit 15 and then to gates of NMOS transistors N11, N12, N14 and N15 of the pair of current mirror-type sense amplification circuits 18 and 18'. The transferred voltages are primarily amplified by the pair of current mirror-type sense amplification circuits 18 and 18' and secondarily by the voltage sense amplification circuit 19. As a result, the voltage sense amplification circuit 19 provides the amplified final output Sout.

Noticeably, provided that NMOS transistors are used in the pull-up circuit 14 instead of the PMOS transistors, consumption of threshold voltages thereof cause a voltage reduction. To prevent such a voltage reduction, the PMOS transistors are used in the pull-up circuit 14 with no use of the NMOS transistors. Namely, if the SRAM is pulled up by the NMOS transistors, the voltage reduction occurs due to the consumption of the threshold voltages of the NMOS transistors. This voltage reduction is not applicable to the SRAM requiring low power.

FIG. 2 is a graph illustrating an operating characteristic of the conventional sense amplifier in FIG. 1. As shown in this drawing, the supply voltage is decreased from 5 V (lines A) to 3.3 V (lines B) by the PMOS transistors of the pull-up circuit, thereby causing the final output Sout from the sense amplifier to have a gain (line C') smaller than that (line C) of 5 V and a long delay time. As a result, a voltage gain characteristic of the sense amplifier becomes unstable. To solve this problem, there must be used an additional address transition detection (ATD) circuit to generate an equalize pulse. The use of the additional ATD circuit results in an increase in the power consumption.

SUMMARY OF THE INVENTION

Therefore, the present invention has been made in view of the above problem, and it is an object of the present invention to provide a low-power, high-speed sense amplifier in which voltages on data bus and data bus bar lines are decreased by a voltage shifter, gains of the decreased voltages are increased by a current sense amplification circuit and the resultant voltages are sensed by a voltage sense amplifier, so that the operation is stably performed and a delay time is reduced even with the use of PMOS transistors of a pull-up circuit at a low supply voltage, thereby causing the operation to be performed at a high speed with low power consumption.

In accordance with the present invention, the above and other objects can be accomplished by a provision of a low-power, high-speed sense amplifier for a memory device with at least one memory cell, comprising voltage shifting means for inputting voltages from data bus and data bus bar lines connected respectively to bit and bit bar lines connected to said memory cell and, in response to a sense amplifier enable signal, decreasing the inputted voltages and shifting the decreased voltages; current sense amplification means responsive to the sense amplifier enable signal for sensing current of an output voltage from said voltage shifting means to increase a gain thereof; and voltage sense amplification means for sensing a difference between the output voltage from said voltage shifting means and an output voltage from said current sense amplification means.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENT

Figure 1:
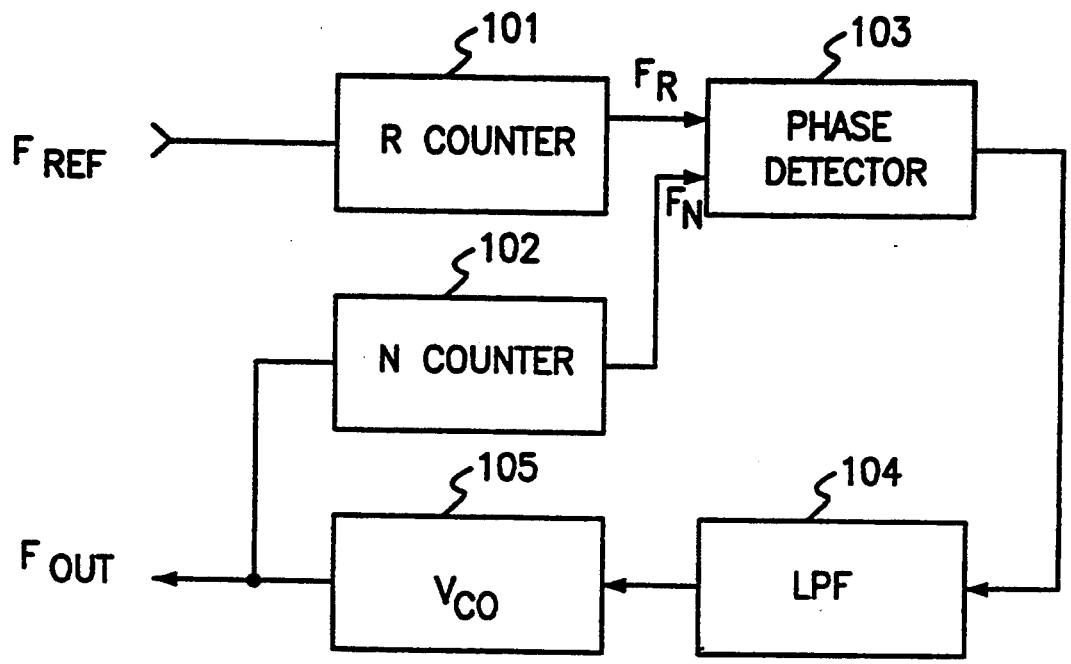
FIG. 1 is a circuit diagram of an SRAM to which a conventional sense amplifier is applied.
Figure 2:
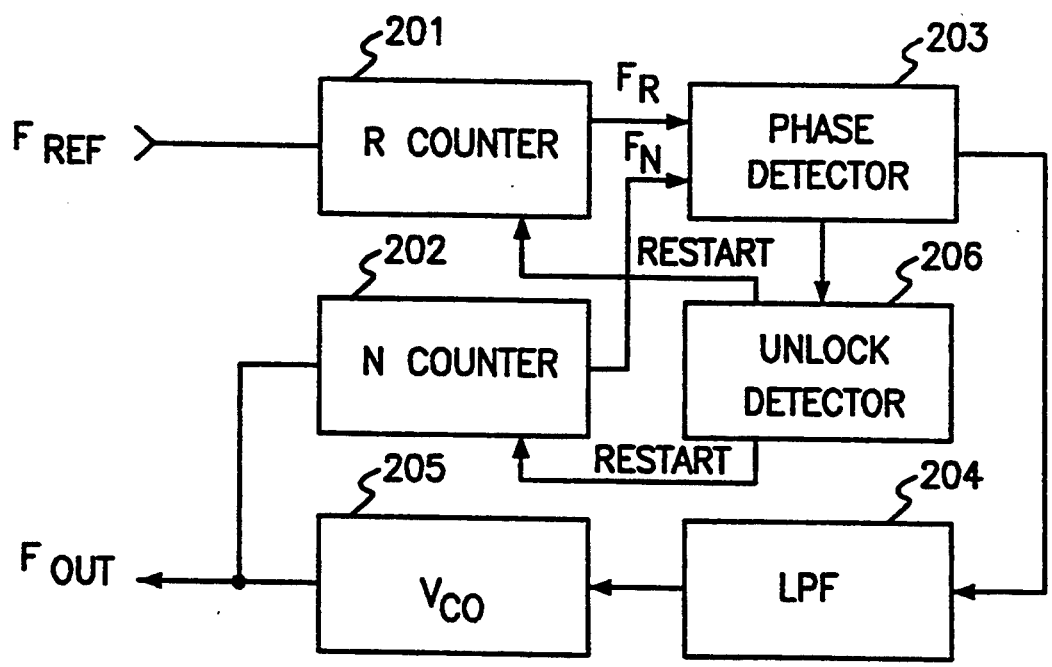
FIG. 2 is a graph illustrating an operating characteristic of the conventional sense amplifier in FIG. 1.
Figure 3:
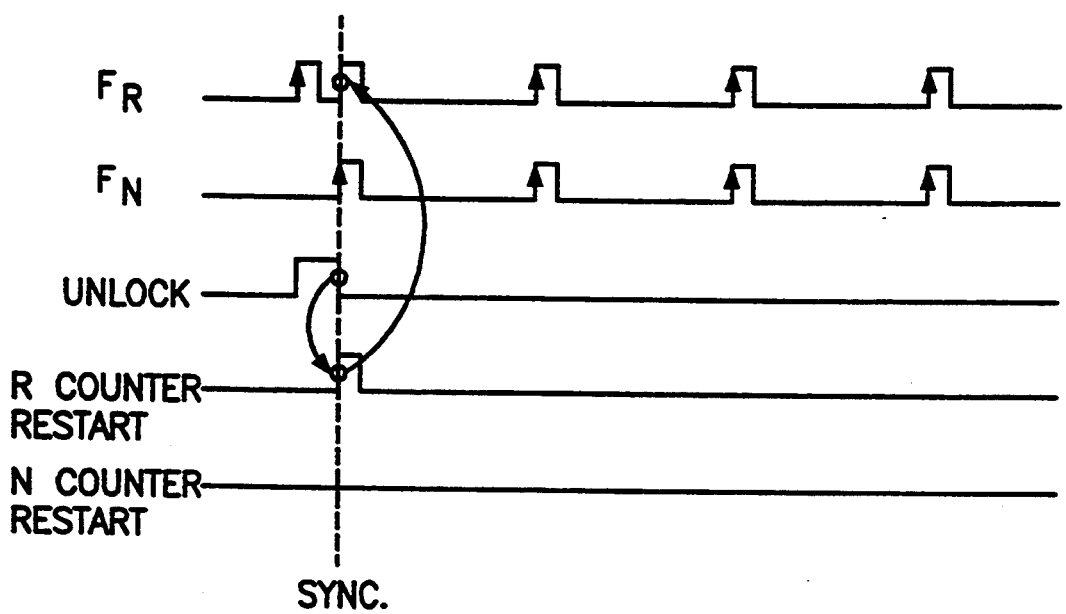
FIG. 3 is a circuit diagram of an SRAM to which a sense amplifier of the present invention is applied.

Referring to FIG. 3, there is shown a circuit diagram of an SRAM to which a sense amplifier of the present invention is applied. As shown in this drawing, the sense amplifier comprises a voltage shifter 28 for shifting voltages on data bus and data bus bar lines 26 and 26' which are transferred from bit and bit bar lines 22 and 22' to the data bus and data bus bar lines 26 and 26' through a transfer gate circuit 24 when they are operated in the neighborhood of a supply voltage by PMOS transistors of a pull-up circuit 24, a current sense amplification circuit 28' for increasing a current gain of an output voltage from the voltage shifter 28, and a voltage sense amplification circuit 29 for amplifying a difference between the output voltage from the voltage shifter 28 and an output voltage from the current sense amplification circuit 28' and providing the resultant final output Sout.

The voltage shifter 28 connected to the data bus and data bus bar lines 26 and 26' is operated responsive to a sense amplifier enable signal SAE from a sense amplifier enable signal supply line 27 to decrease the voltages on the data bus and data bus bar lines 26 and 26' and shift the decreased voltages. The current sense amplification circuit 28' is also operated responsive to the sense amplifier enable signal SAE to sense the current of the output voltage from the voltage shifter 28 to increase the gain thereof.

The resultant output voltages S1 and /S1 from the voltage shifter 28 and the current sense amplification circuit 28′ make the difference between the voltages on the data bus and data bus bar lines 26 and 26′ large to read information from a cell. Then, the resultant output voltages S1 and /S1 from the voltage shifter 28 and the current sense amplification circuit 28′ are sensed and amplified by the voltage sense amplification circuit 29.

The above-mentioned construction and operation of the sense amplifier in accordance with the present invention will hereinafter be described in detail.

The voltage shifter 28 includes a pair of NMOS transistors N21 and N22 acting as a variable resistor. The NMOS transistors N21 and N22 have gates for inputting the voltages on the data bus and data bus bar lines 26 and 26′, respectively. As a result, the NMOS transistors N21 and N22 are adapted to control an amount of current flowing through a self-current path according to the gate voltages. The voltage shifter 28 also includes a pair of PMOS transistors P21 and P22 acting as a fixed resistor as a current source. The PMOS transistors P21 and P22 have drains connected to drains of the NMOS transistors N21 and N22, respectively, gates connected in common to a ground voltage Vss and sources connected in common to the supply voltage Vcc. Also, the voltage shifter 28 includes an NMOS transistor N23 acting as a diode. The NMOS transistor N23 has a drain and a gate connected in common to a common source of the NMOS transistors N21 and N22. Further, the voltage shifter 28 includes an NMOS transistor N24 acting as a switch for turning on/off a current path of the voltage shifter 28. The NMOS transistor N24 has a drain connected to a source of the NMOS transistor N23, a gate for inputting the sense amplifier enable signal SAE and a source connected to the ground voltage Vss. With this construction, the voltage shifter 28 decreases the voltages on the data bus and data bus bar lines 26 and 26′ and shifts the decreased voltages.

The current sense amplification circuit 28′ includes a pair of NMOS transistors N25 and N26 acting as a variable resistor. The NMOS transistor N26 has a drain for inputting current flowing between the NMOS transistor N21 and the PMOS transistor P21 and a gate for inputting a feedback drain voltage of the NMOS transistor N25. The NMOS transistor N25 has a drain for inputting current flowing between the NMOS transistor N22 and the PMOS transistor P22 and a gate for inputting a feedback drain voltage of the NMOS transistor N26. As a result, the NMOS transistors N25 and N26 are adapted to control an amount of current flowing through a self-current path according to the gate voltages. The current sense amplification circuit 28′ also includes an NMOS transistor N27 acting as a switch for turning on/off a current path of the current sense amplification circuit 28′. The NMOS transistor N27 has a drain connected to a common source of the NMOS transistors N25 and N26, a source connected to the ground voltage Vss and a gate for inputting the sense amplifier enable signal SAE.

The voltage sense amplification circuit 29 are adapted to input the output signal S1 from the voltage shifter 28 and the output signal /S1 from the current sense amplification circuit 28′ and provide the amplified final output Sout. The construction and operation of the voltage sense amplification circuit 29 are well-known in the art and details thereof will thus be omitted.

Figure 4:
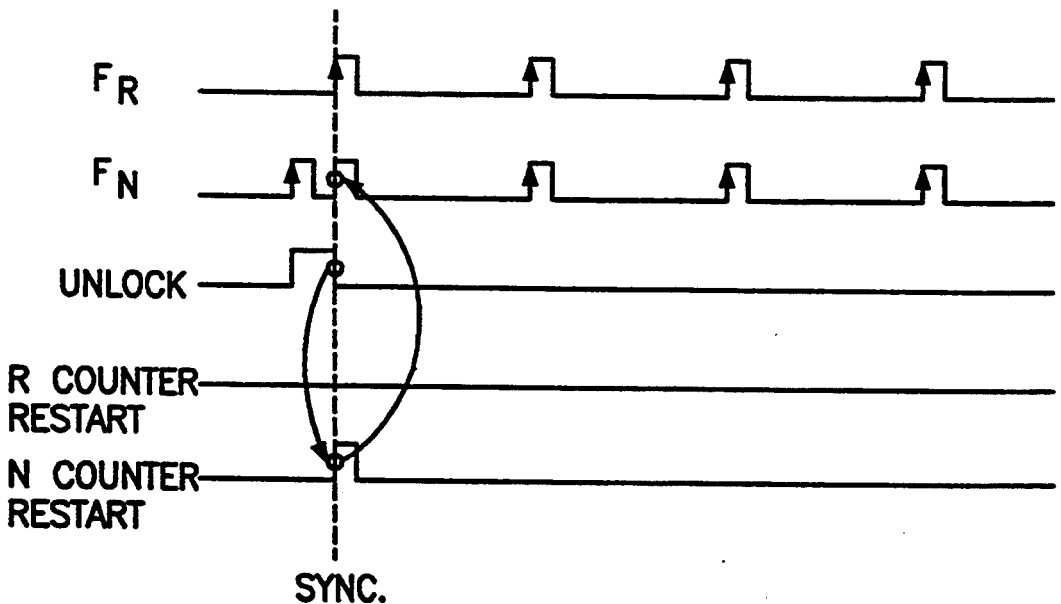
FIGS. 4 to 7 are graphs illustrating an operating characteristic of the sense amplifier in FIG. 3.
Figure 5:
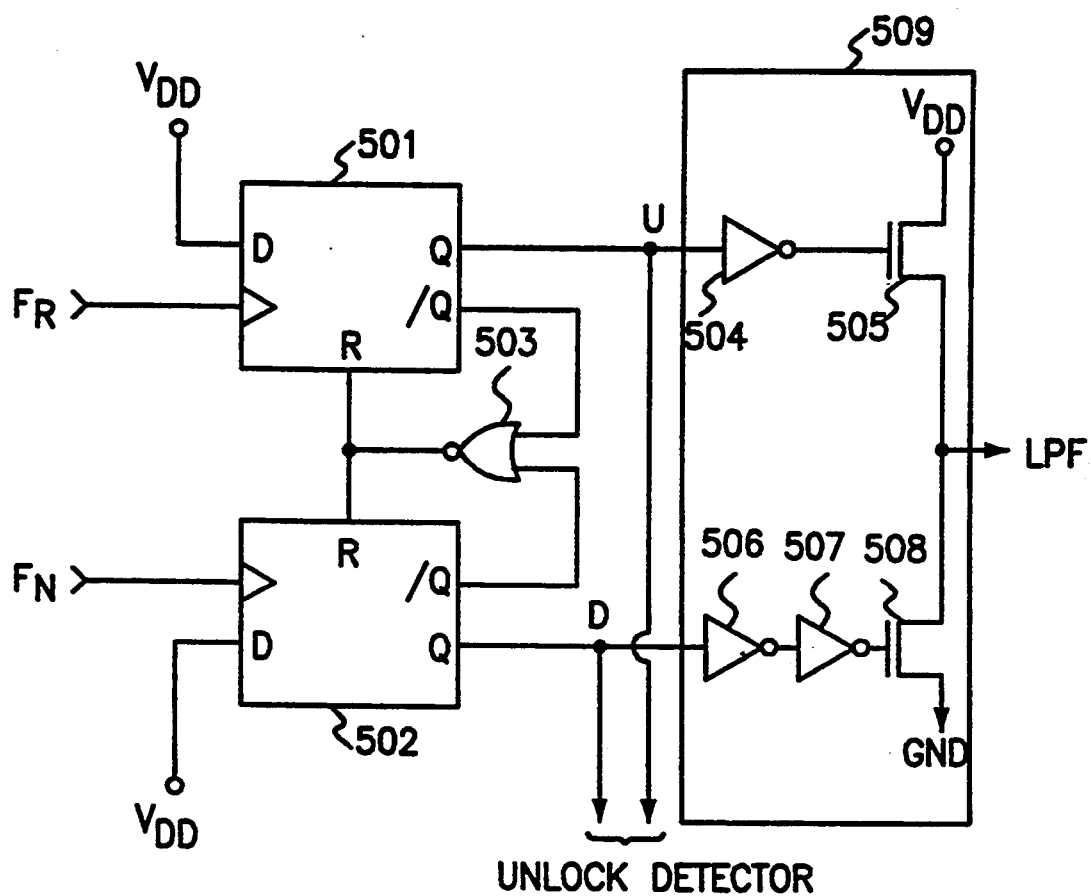
Figure 6:
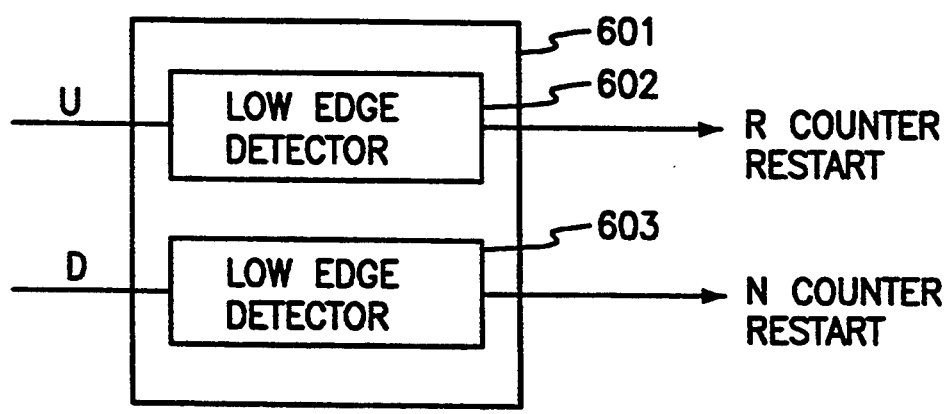
Figure 7:
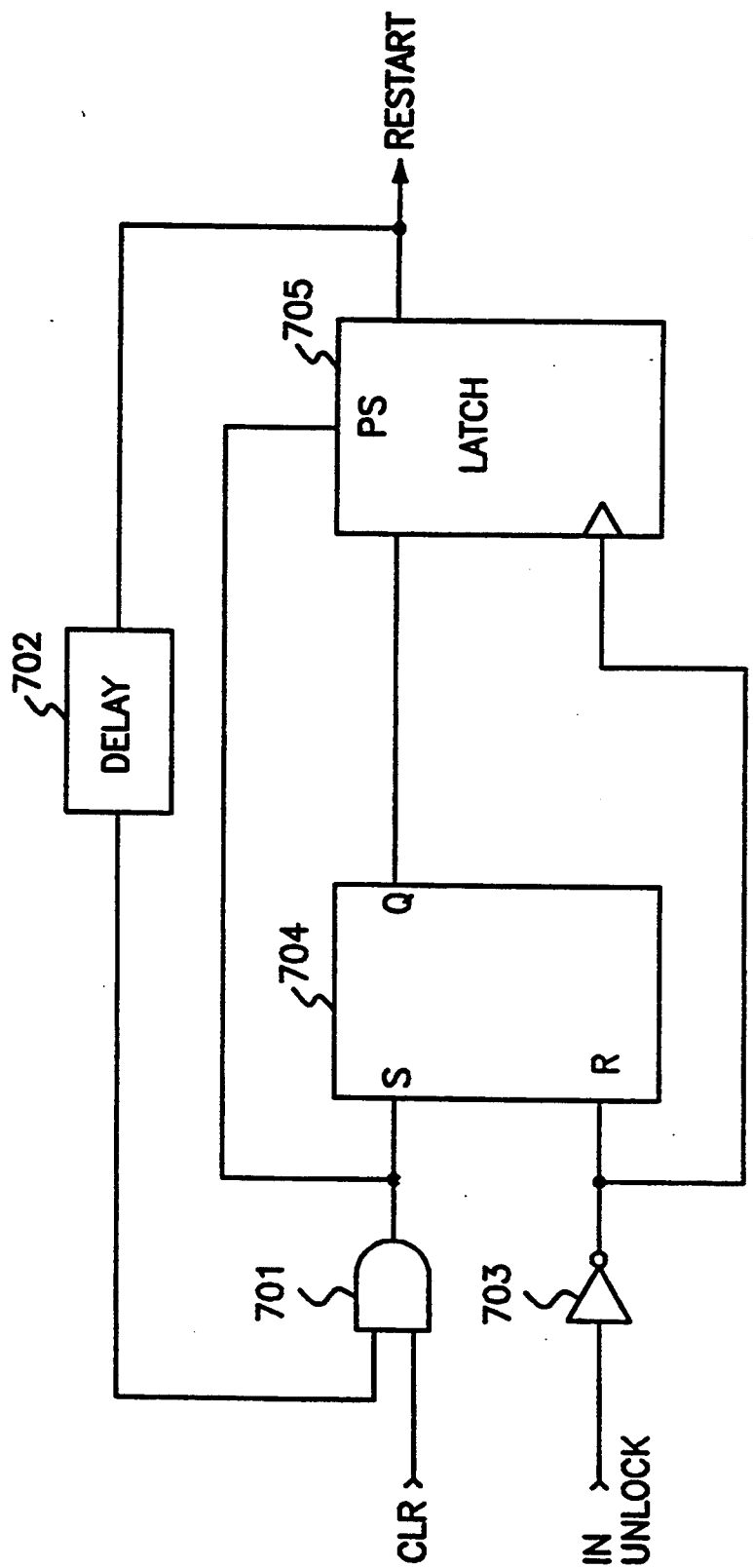
Figure 1:
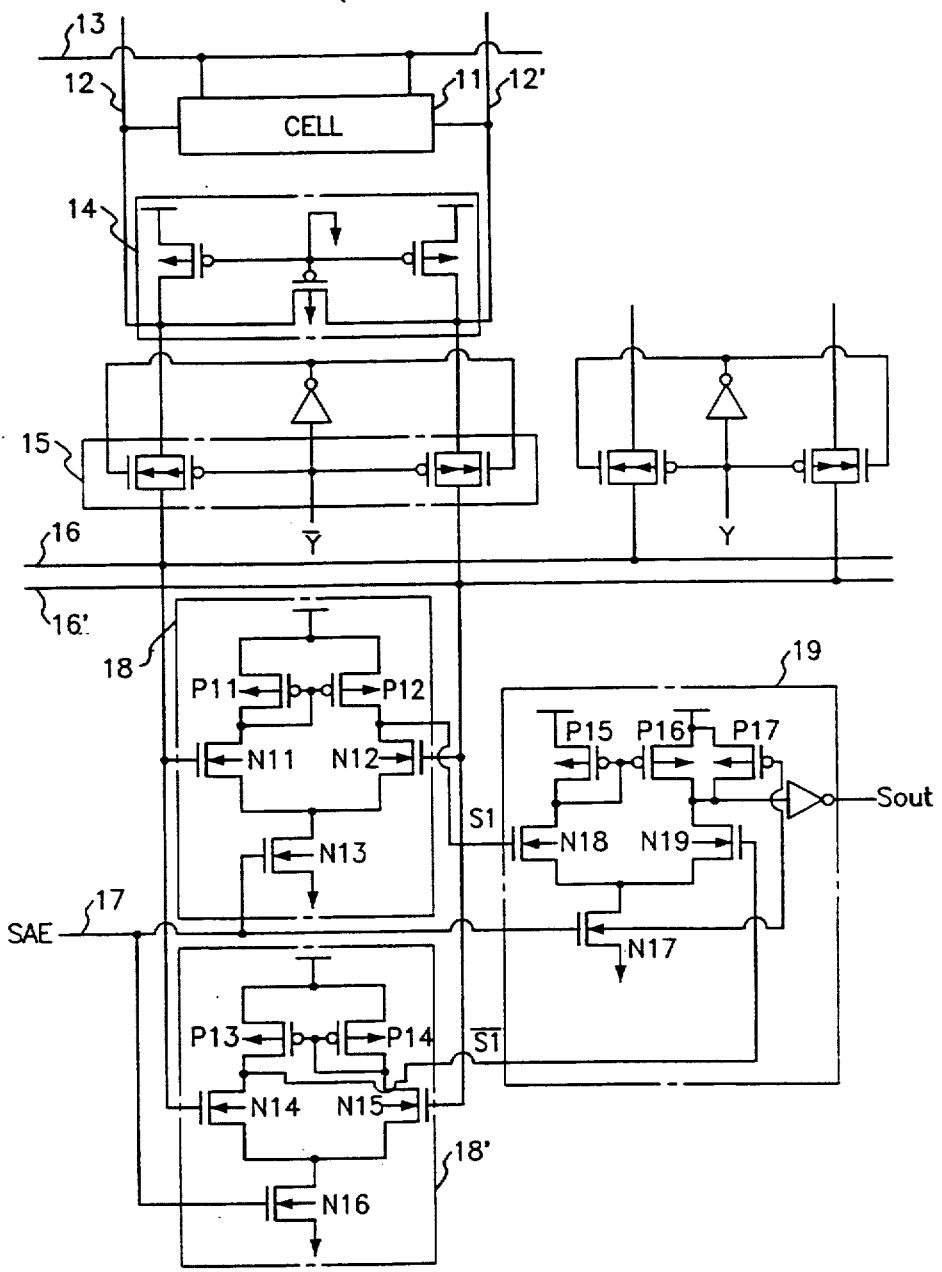
Figure 2:
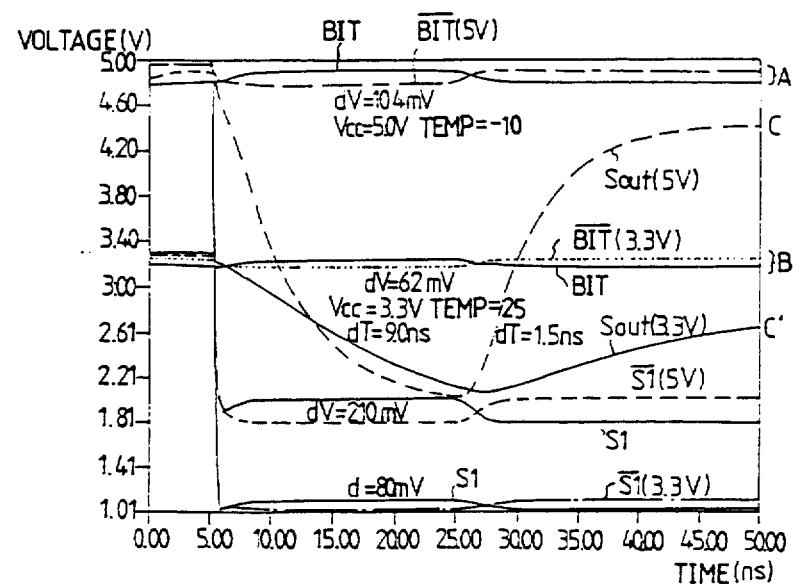
Figure 3:
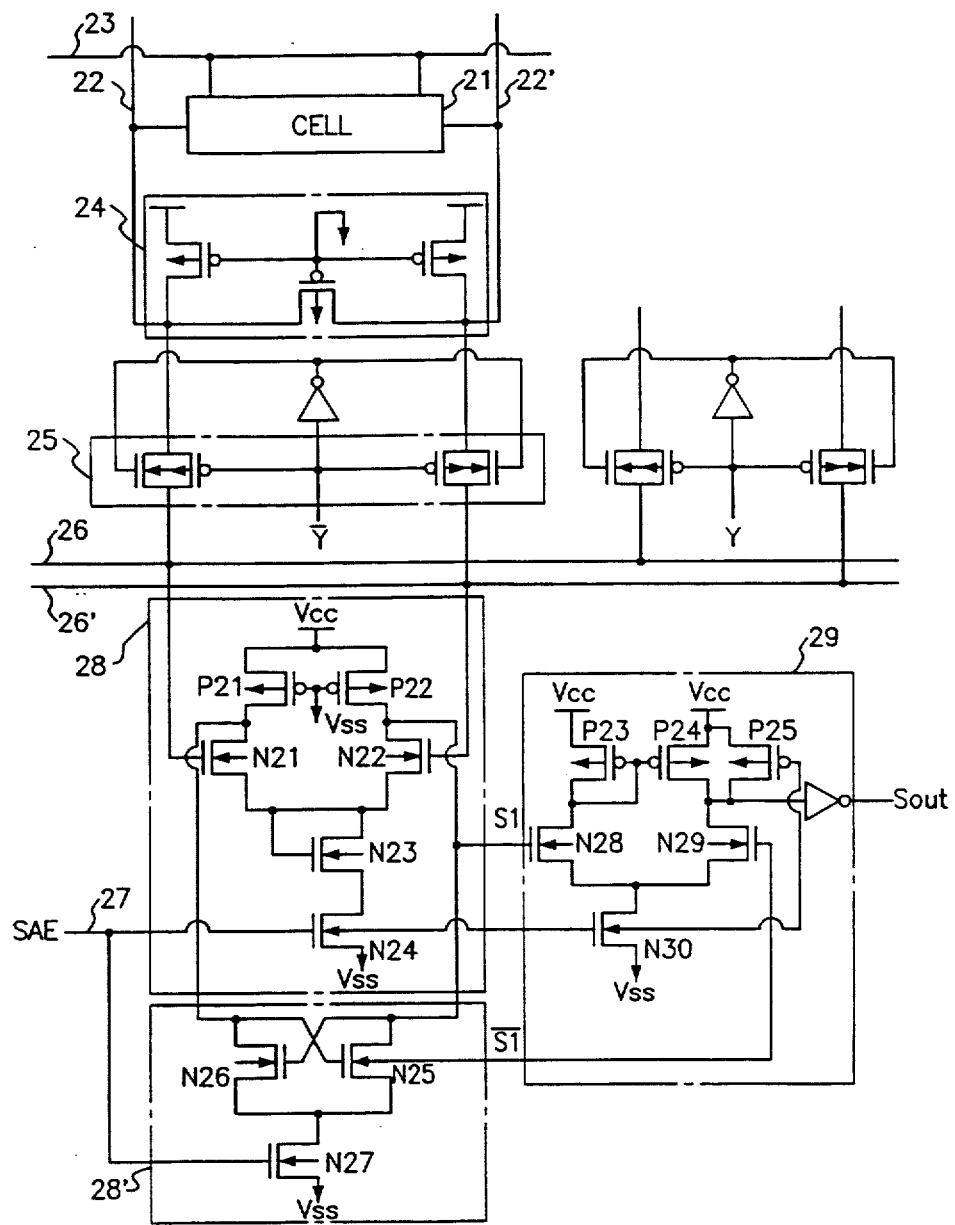
Figure 4:
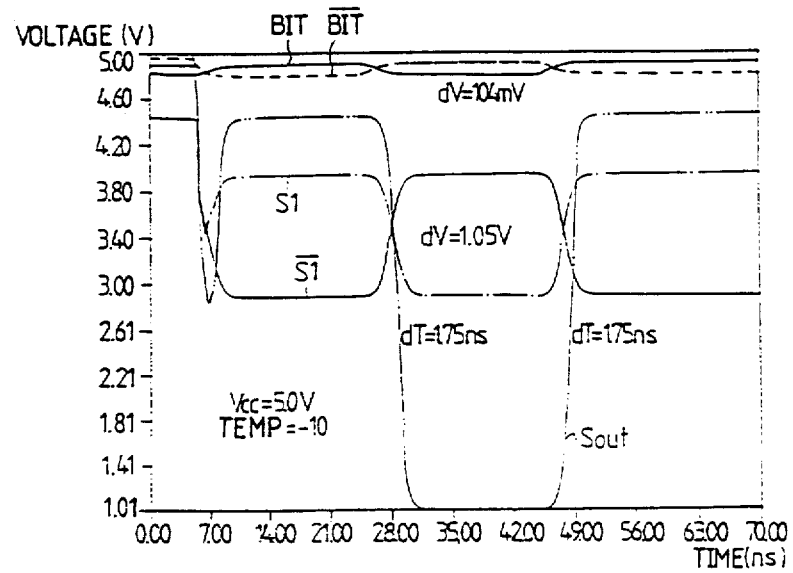
Figure 5:
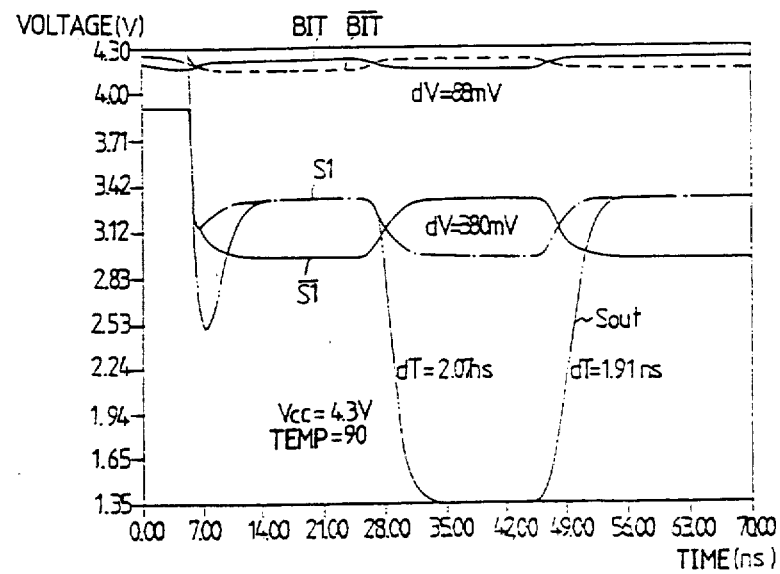
Figure 6:
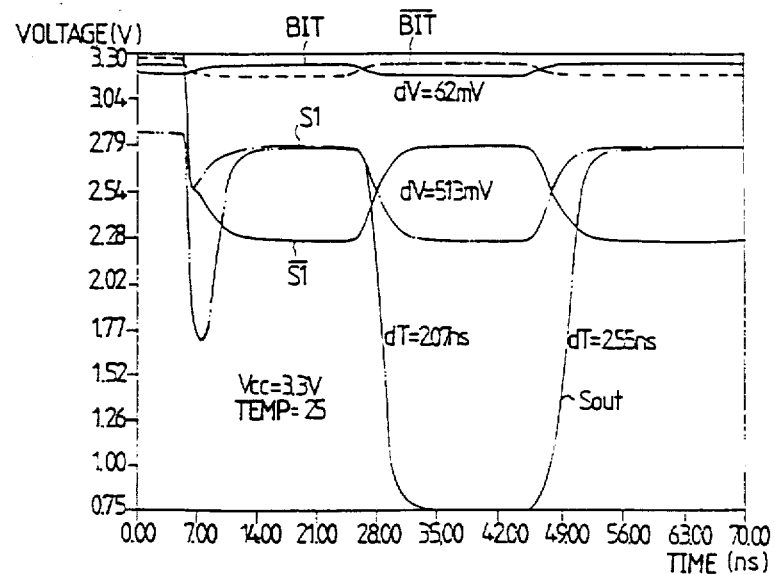
Figure 7:
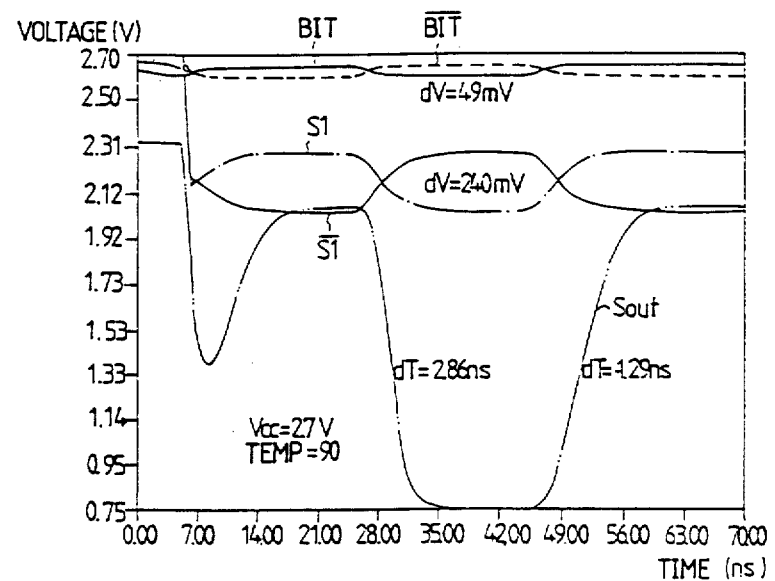

FIGS. 4 to 7 are graphs illustrating an operating characteristic of the sense amplifier in accordance with the present invention. FIG. 4 shows the voltages on the bit and bit bar lines 22 and 22′, the output signal S1 from the voltage shifter 28, the output signal /S1 from the current sense amplification circuit 28′ and the final output Sour from the sense amplifier under the condition that the supply voltage Vcc is 5 V and a temperature is −10° C. FIGS. 5 to 7 show the voltages on the bit and bit bar lines 22 and 22′, the output signal S1 from the voltage shifter 28, the output signal /S1 from the current sense amplification circuit 28′ and the final output Sout from the sense amplifier under the conditions that the supply voltage Vcc is 4.3 V, 3.3 V and 2.7 V and the temperature is 90° C., 25° C. and 90° C., respectively.

As apparent from the above description, according to the present invention, the sense amplifier is operable with the reduced power consumption with no use of the ATD circuit for generation of the equalize pulse. Therefore, although the voltage difference is small, the power consumption is minimized, the delay time is shortened and a swing width of the bit line is reduced. These have the effect of decreasing the delay time of the bit line and removing the bit equalize.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

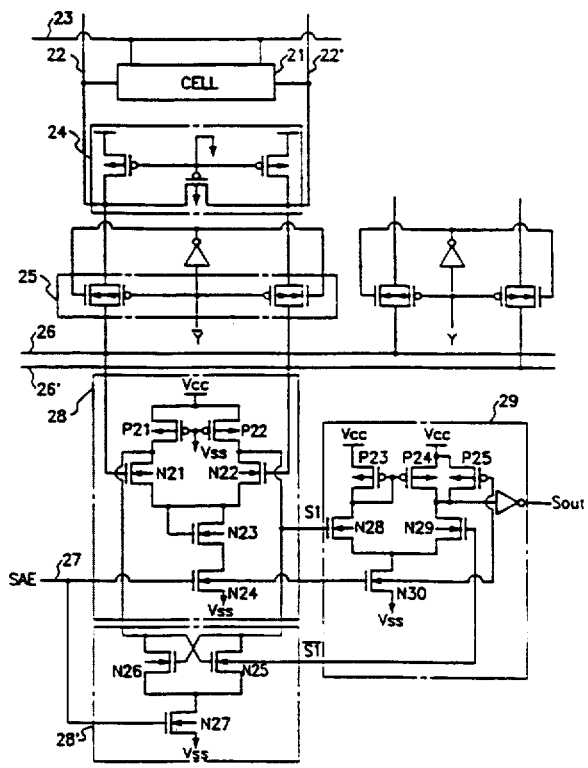

What is claimed is:

1. A low-power, high-speed sense amplifier for a memory device with at least one memory cell, comprising:

voltage shifting means for inputting voltages from data bus and data bus bar lines connected respectively to bit and bit bar lines connected to said memory cell and, in response to a sense amplifier enable signal, decreasing the inputted voltages and shifting the decreased voltages;

current sense amplification means responsive to the sense amplifier enable signal for sensing current of an output voltage from said voltage shifting means to increase a gain thereof; and voltage sense amplification means for sensing a difference between the output voltage from said voltage shifting means and an output voltage from said current sense amplification means.

2. A low-power, high-speed sense amplifier as set forth in claim 1, wherein said voltage shifting means includes:

first variable resistor means for controlling an amount of current flowing through a self-current path according to the voltages from said data bus and data bus bar lines;

fixed resistor means connected in series between said variable resistor means and a first power source terminal for acting as a current source;

diode means connected to said variable resistor means for maintaining a constant voltage; and first switching means responsive to the sense amplifier enable signal for turning on/off a current path between said diode means and a second power source terminal.

3. A low-power, high-speed sense amplifier as set forth in claim 2, wherein said current sense amplification means includes:

second variable resistor means connected to a current path between said first variable resistor means and said fixed resistor means in said voltage shifting means for controlling an amount of current flowing through a self-current path according to voltages generated from the connected current path; and second switching means responsive to the sense amplifier enable signal for turning on/off a current path between said second variable resistor means and said second power source terminal.

4. A low-power, high-speed sense amplifier as set forth in claim 3, wherein said first variable resistor means includes:

a pair of first NMOS transistors having gates for inputting the voltages from said data bus and data bus bar lines, respectively.

5. A low-power, high-speed sense amplifier as set forth in claim 4, wherein said fixed resistor means includes:

a pair of first PMOS transistors having drains connected to drains of said pair of first NMOS transistors, respectively, gates connected in common to said second power source terminal and sources connected in common to said first power source terminal.

6. A low-power, high-speed sense amplifier as set forth in claim 5, wherein said diode means includes:

a second NMOS transistor having a drain and a gate connected in common to a common source of said pair of first NMOS transistors.

7. A low-power, high-speed sense amplifier as set forth in claim 6, wherein said first switching means includes:

a third NMOS transistor having a drain connected to a source of said second NMOS transistor, a gate for inputting the sense amplifier enable signal and a source connected to said second power source terminal.

8. A low-power, high-speed sense amplifier as set forth in claim 7, wherein said second variable resistor means includes:

a pair of fourth NMOS transistors, one of said fourth NMOS transistors having a drain for inputting current flowing between one of said pair of first NMOS transistors and one of said pair of first PMOS transistors in said voltage shifting means and a gate for inputting a feedback drain voltage of the other of said fourth NMOS transistors, the other of said fourth NMOS transistors having a drain for inputting current flowing between the other of said pair of first NMOS transistors and the other of said pair of first PMOS transistors and a gate for inputting a feedback drain voltage of said one of said fourth NMOS transistors.

9. A low-power, high-speed sense amplifier as set forth in claim 8, wherein said second switching means includes:

a fifth NMOS transistor having a drain connected to a common source of said pair of fourth NMOS transistors, a source connected to said second power source terminal and a gate for inputting the sense amplifier enable signal.

10. A low-power, high-speed sense amplifier as set forth in claim 9, wherein said first power source terminal is a supply voltage terminal and said second power source terminal is a ground voltage terminal.

* * * * *

UNITED STATES PATENT AND TRADEMARK OFFICE
CERTIFICATE OF CORRECTION

PATENT NO. : 5,436,866

DATED : July 25, 1995

INVENTOR(S) : Seong Jung Jang

It is certified that error appears in the above-identified patent and that said Letters Patent is hereby corrected as shown below:

Title page, should be deleted showing the illustrated figure, and substitute with the attached title page, showing the illustrated figure.

In the Drawings, Figs 1-7 should be deleted and replaced with the attached Figs 1-7.

Signed and Sealed this

Ninth Day of January, 1996

Attest:

BRUCE LEHMAN

*Attesting Officer*    *Commissioner of Patents and Trademarks*

United States Patent [19]

Jang

[11] Patent Number: 5,436,866
[45] Date of Patent: Jul. 25, 1995

[54] LOW-POWER, HIGH-SPEED SENSE AMPLIFIER

[75] Inventor: Seong J. Jang, Bubaleub, Rep. of Korea

[73] Assignee: Hyundai Electronics Industries Co., Ltd., Rep. of Korea

[21] Appl. No.: 319,300

[22] Filed: Oct. 6, 1994

[30] Foreign Application Priority Data

Oct. 6, 1993 [KR] Rep. of Korea ............... 1993-20668

[51] Int. Cl.⁶ .................................................. G11C 7/00
[52] U.S. Cl. ............................ 365/208; 365/189.11; 365/207; 327/51
[58] Field of Search ............... 365/208, 207, 206, 205, 365/189.11; 327/51, 52, 53

[56] References Cited

U.S. PATENT DOCUMENTS

| | | | |
|---|---|---|---|
| 4,618,785 | 10/1986 | Van Tran | 365/208 |
| 4,636,664 | 1/1987 | Craycraft et al. | 327/51 |
| 4,984,204 | 1/1991 | Sato et al. | 365/189.11 |
| 5,301,158 | 4/1994 | Yokomizo | 365/205 |
| 5,371,703 | 12/1994 | Miyamoto | 365/207 X |
| 5,377,143 | 12/1994 | McClure | 365/189.11 X |

Primary Examiner—Joseph A. Popek
Assistant Examiner—Son Dinh
Attorney, Agent, or Firm—Merchant, Gould, Smith Edell, Welter & Schmidt

[57] ABSTRACT

A low-power, high-speed sense amplifier for a memory device with at least one memory cell, comprising a voltage shifter for inputting voltages from data bus and data bus bar lines connected respectively to bit and bit bar lines connected to the memory cell and, in response to a sense amplifier enable signal, decreasing the inputted voltages and shifting the decreased voltages, a current sense amplification circuit responsive to the sense amplifier enable signal for sensing current of an output voltage from the voltage shifter to increase a gain thereof, and a voltage sense amplification circuit for sensing a difference between the output voltage from the voltage shifter and an output voltage from the current sense amplification circuit.

10 Claims, 4 Drawing Sheets